(12) United States Patent
Kukulka et al.

(10) Patent No.: US 8,044,295 B2
(45) Date of Patent: *Oct. 25, 2011

(54) SOLAR CELL WITH HIGH-TEMPERATURE FRONT ELECTRICAL CONTACT

(75) Inventors: Jerry R. Kukulka, Santa Clarita, CA (US); Maggy L. Lau, Hacienda Heights, CA (US); Peter Hebert, Sierra Madre, CA (US)

(73) Assignee: The Boeing Company, Inc., Seattle, WA (US)

( * ) Notice: Subject to any disclaimer, the term of this patent is extended or adjusted under 35 U.S.C. 154(b) by 265 days.

This patent is subject to a terminal disclaimer.

(21) Appl. No.: 11/851,737

(22) Filed: Sep. 7, 2007

(65) Prior Publication Data

US 2007/0295397 A1    Dec. 27, 2007

Related U.S. Application Data

(63) Continuation of application No. 10/623,900, filed on Jul. 21, 2003, now Pat. No. 7,285,720.

(51) Int. Cl.
*H01L 31/0224* (2006.01)
(52) U.S. Cl. .................. 136/256; 136/261; 136/262
(58) Field of Classification Search .......... 136/243–265; 257/431–466, 751–770, E27.123–125, E25.007
See application file for complete search history.

(56) References Cited

U.S. PATENT DOCUMENTS

| | | | |
|---|---|---|---|
| 3,736,180 A | 5/1973 | Fischer et al. | |
| 4,124,455 A | 11/1978 | Lindmayer | |
| 4,340,803 A * | 7/1982 | Coyle | 219/56.22 |
| 4,468,853 A | 9/1984 | Morita et al. | |
| 5,075,763 A | 12/1991 | Spitzer et al. | |
| 5,103,268 A | 4/1992 | Yin et al. | |
| 5,330,585 A | 7/1994 | Chang et al. | |
| 5,928,438 A | 7/1999 | Saiami et al. | |
| 7,285,720 B2 * | 10/2007 | Kukulka et al. | 136/256 |

* cited by examiner

*Primary Examiner* — Jessica L Ward
*Assistant Examiner* — Kevin E Yoon
(74) *Attorney, Agent, or Firm* — McNees Wallace & Nurick LLC

(57) ABSTRACT

A solar cell has an active semiconductor structure and a back electrical contact overlying and contacting an active semiconductor structure back side. A front electrical contact is applied overlying and contacting the active semiconductor structure front side. The front electrical contact has multiple layers including a titanium layer overlying and contacting the active semiconductor structure front side, a diffusion layer overlying and contacting the titanium layer, a barrier layer overlying and contacting the diffusion layer, and a joining layer overlying and contacting the barrier layer. The front electrical contact may be applied by sequentially vacuum depositing the titanium layer, the diffusion layer, the barrier layer, and the joining layer in a vacuum deposition apparatus in a single pumpdown from ambient pressure. A front electrical lead is affixed overlying and contacting an attachment pad region of the front electrical contact.

7 Claims, 2 Drawing Sheets

SOLAR CELL WITH HIGH-TEMPERATURE FRONT ELECTRICAL CONTACT

This invention relates to a solar cell and, more particularly, to a solar cell having a front electrical contact that is suitable for use for extended periods of time and many duty cycles at elevated temperature.

BACKGROUND OF THE INVENTION

A solar cell has an active semiconductor structure including two semiconductor layers in facing contact with each other at a semiconductor junction. When illuminated by the sun or otherwise, the solar cell produces a voltage between the semiconductor layers and thence between a front side and a back side of the active semiconductor structure. ("Front side" refers to the side facing toward the sun, and "back side" refers to the side facing away from the sun.) Advanced solar cells may include more than two semiconductor layers and their respective pairwise semiconductor junctions. The various pairs of semiconductor layers of the advanced solar cells are tuned to the various spectral components of the sun to maximize the power output of the solar cell.

Electrical contacts are applied to the front side and to the back side of the solar cell. The back electrical contact normally is a continuous electrically conductive layer deposited across all or most of the entire back side of the active semiconductor structure, inasmuch as the back side faces away from the sun during service. The front electrical contact normally includes a plurality of interconnected current-gathering strips deposited upon the front side of the active semiconductor structure. At discrete locations, attachment pad regions are defined on the strips so that external electrical leads may be affixed to the front electrical contact.

Solar cells are used in space and terrestrial applications. Particularly for space applications where the solar cells may be inaccessible for many years, and go through many thousands of sunlight/shade (i.e., heating/cooling) duty cycles without any maintenance, the solar cells must be highly reliable. If the structure and performance of any element of the solar cell degrade during service, the power output of that solar cell may be permanently reduced and eventually lost.

During service, the temperature of the solar cell is elevated above the temperature of the ambient surroundings. Some advanced solar cells, such as concentrator solar cells where multiples of the sun power are concentrated on the face of the solar cell by a mirror, reach temperatures of 80-140° C. in current designs. Over periods of 15-25 years and thousands of duty cycles, diffusional processes may cause progressive degradation of the structure of the solar cell that eventually leads to a decrease in performance.

Operable solar cells are known, but there is an ongoing need for an approach to increase the reliability of existing types of solar cells and to achieve high reliability in future types of solar cells. The present invention fulfills this need, and further provides related advantages.

SUMMARY OF THE INVENTION

The present invention provides a solar cell and a method for its fabrication. The structure of the solar cell has improved reliability, as compared with conventional solar cells, during elevated temperature exposure for extended periods of time and many duty cycles. The improved reliability is based on an improved structure for the front electrical contact. The front electrical contact may be vacuum deposited in a single pumpdown from ambient pressure, reducing cost and the possibility of contamination of the surfaces of the layers.

In accordance with the invention, a solar cell comprises an active semiconductor structure having an active semiconductor structure front side and an active semiconductor structure back side. The solar cell active semiconductor structure may be of any operable type, but in current designs typically comprises a doped silicon layer and/or a doped gallium arsenide layer. For the advanced solar cells with multiple semiconductor layers, there are different pairs of active semiconductor layers that are responsive to different wavelength components of the solar spectrum. The solar cell active semiconductor structure produces a voltage between the active semiconductor structure front side and the active semiconductor structure back side when illuminated. A back electrical contact overlies and contacts the active semiconductor structure back side. A front electrical contact overlies and contacts the active semiconductor structure front side. The front electrical contact includes the current collectors, the busbars, and the attachment pads.

The front electrical contact has multiple layers comprising a titanium layer overlying and contacting the active semiconductor structure front side, a diffusion layer overlying and contacting the titanium layer, a barrier layer overlying and contacting the diffusion layer, and a joining layer overlying and contacting the barrier layer. The diffusion layer is preferably gold, but other metals such as palladium may be used in some circumstances. The barrier layer is preferably platinum, but nickel, palladium, rhodium, or other noble metals, may be used in some circumstances. The joining layer is preferably silver, but other metals such as gold, aluminum, or copper may be used in some circumstances.

When the solar cell is interconnected with other solar cells to form an array, a front electrical lead overlies and is affixed to an attachment pad region of the front electrical contact. In some cases, the front electrical lead is a discrete wire, and in other cases the front electrical lead is deposited upon the front side of the solar cell. In a typical case, the front electrical lead is made of silver, kovar™, molybdenum, invar™, aluminum, or gold. As used here unless otherwise stated, the specification of a metal may include the unalloyed metal or alloys of the metal. In most cases, the pure metals are used to maximize electrical conductivity, but in some cases alloys of the specified metal with other elements may be used for improved strength or other properties.

Preferably, the titanium layer has a thickness of from about 50 Angstroms to about 250 Angstroms, the diffusion layer has a thickness of from about 100 Angstroms to about 600 Angstroms, the barrier layer has a thickness of from about 100 Angstroms to about 1000 Angstroms, and the joining layer has a thickness of from about 20,000 Angstroms to about 70,000 Angstroms.

A method for fabricating a solar cell comprises providing an active semiconductor structure having an active semiconductor structure front side and an active semiconductor structure back side, wherein the solar cell active semiconductor structure produces a voltage between the active semiconductor structure front side and the active semiconductor structure back side when illuminated, and a back electrical contact overlying and contacting the active semiconductor structure back side. A front electrical contact is applied overlying and contacting the active semiconductor structure front side. The front electrical contact has multiple layers comprising a titanium layer overlying and contacting the active semiconductor structure front side, a diffusion layer overlying and contacting the titanium layer, a barrier layer overlying and contacting the diffusion layer, and a joining layer overlying and contacting the barrier layer. Other compatible features discussed herein may be used in relation to this fabrication approach.

The step of applying preferably includes the step of sequentially depositing the titanium layer, the diffusion layer, the barrier layer, and the joining layer. Most preferably, these layers are applied by sequentially vacuum depositing the titanium layer, the diffusion layer, the barrier layer, and the joining layer in a vacuum deposition apparatus in a single pumpdown from ambient pressure to the vacuum required for the deposition.

One source of degradation of a solar cell exposed to elevated temperatures during many duty cycles is a diffusion of metallic atoms from the front electrical contact to the bondline between the front electrical contact and the active semiconductor structure, and thence into the active semiconductor structure itself. The presence of foreign metallic atoms at or near the bondline may degrade the adhesion between the front electrical contact and the active semiconductor structure, causing it to separate from the front side of the active semiconductor structure. Foreign metallic atoms diffusing into the active semiconductor structure alter its doping, thereby potentially reducing its electrical performance.

In the present approach, the barrier layer is provided in the front electrical contact to serve as a diffusion barrier. Most other elements diffuse very slowly through such diffusion-barrier metals, so that the barrier layer serves as a diffusion barrier against the diffusion of any overlying metallic elements into the underlying structure, and specifically to the bondline between the front electrical contact and the active semiconductor structure, and thence into the active semiconductor structure.

The selection of the composition and ordering of the layers of the front electrical contact is critical and is not arbitrary. Titanium adheres well to semiconductor materials, particularly when gold or other diffusion metal is diffused into and through the titanium layer to the bondline region between the front electrical contact and the active semiconductor structure. The titanium layer must therefore contact the active semiconductor structure, and the diffusion layer must therefore overlie and contact the titanium layer so that gold or other diffusion-layer atoms may diffuse into the titanium layer during fabrication and service. The joining layer must be the topmost layer of the front electrical contact, because it provides a good material for the affixing of the front electrical lead to an attachment pad region of the front electrical contact.

However, the diffusion of metals commonly used in the joining layer and the front electrical lead to the bondline region between the front electrical contact and the active semiconductor structure, and thence into the active semiconductor structure, may cause the degradation in structure and performance. The barrier layer must therefore lie between the diffusion layer and the joining layer, so that it does not prevent the diffusion of the diffusion metal to the bondline region but does prevent diffusion of the joining metal and the metal of the front electrical lead to the bondline region between the front electrical contact and the active semiconductor structure, and thence into the active semiconductor structure. As noted, the barrier layer cannot lie between the active semiconductor structure and the titanium layer, or between the titanium layer and the diffusion layer, because barrier metals do not bond well to semiconductor materials and because its presence in these locations would interfere with the bonding of the front electrical contact to the semiconductor structure.

Comparative accelerated life test results of the present approach suggest that a 3-4 fold increase in lifetime for this new front-contact structure.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
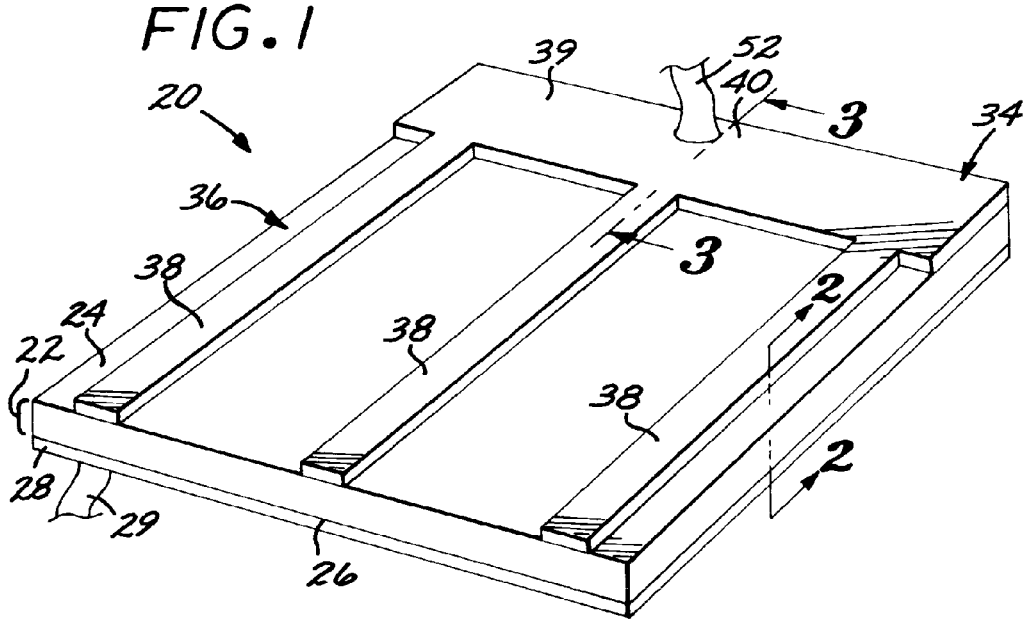
FIG. 1 is a perspective view of a solar cell from the front side.
Figure 2:
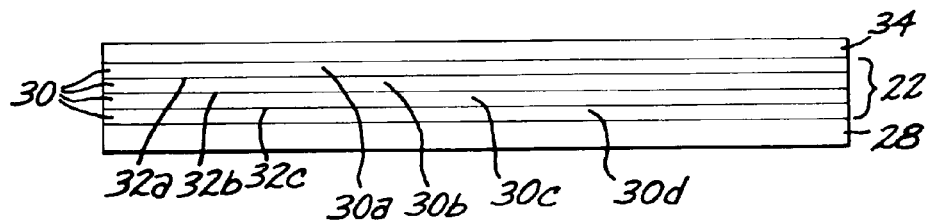
FIG. 2 is an enlarged schematic sectional view on line 2-2 through the solar cell of FIG. 1.
Figure 3:
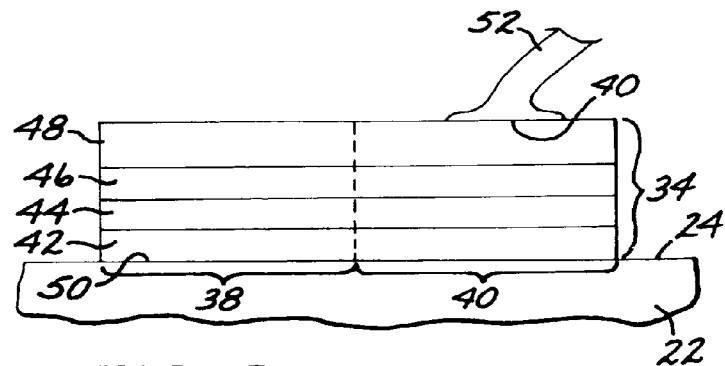
FIG. 3 is an enlarged schematic sectional view on line 3-3 through the solar cell of FIG. 1.

FIG. 1 illustrates the pertinent features of a solar cell 20. The solar cell 20 includes an active semiconductor structure 22 having an active semiconductor structure front side 24 and an active semiconductor structure back side 26. A back electrical contact 28, illustrated as a thin metallic layer, overlies and contacts the active semiconductor structure back side 26. The back electrical contact 28 usually covers the entire active semiconductor structure back side 26. A back electrical lead 29 is affixed to the back electrical contact 28. When the solar cell active semiconductor structure 22 is illuminated by the sun or other light source directed against the active semiconductor structure front side 24, there is a voltage produced between the active semiconductor structure front side 24 and the active semiconductor structure back side 26. FIGS. 1-3 are not drawn to scale.

FIG. 2 shows a portion of this structure in sectional view, further illustrating the details of the active semiconductor structure 22. The structure and fabrication of such active semiconductor structures 22 are known in the art, and only the basic structures are shown here. The active semiconductor structure 22 includes at least two, and in advanced solar cells more than two, semiconductor layers 30. In the illustration, there are four semiconductor layers 30a, 30b, 30c, and 30d. Pairs of the semiconductor layers 30 define semiconductor junctions 32. In the illustration, semiconductor layers 30a and 30b form semiconductor junction 32a; semiconductor layers 30b and 30c form semiconductor junction 32b; and semiconductor layers 30c and 30d form semiconductor junction 32c. In practical cases, there are additional layers at the semiconductor junctions 32 to facilitate their operation but are not shown here to avoid clutter in this schematic illustration. Whether there is a single semiconductor junction 32 or multiple semiconductor junctions 32, the facing pairs of semiconductor layers 30 and their respective semiconductor junctions 32 are selected to respond to the wavelength components of the illuminating light to create a voltage across the contacting semiconductor layers 30 and semiconductor junctions 32. The selections of the specific compositions of the semiconductor layers 30 of the solar cell active semiconductor structure 22, and possible additional layers within the active semiconductor structure, are not a part of the present approach. Typically, however, current technology uses doped silicon semiconductor layers 30 and/or doped gallium arsenide semiconductor layers 30, and modified compositions based upon these base compositions. The present approach may be used with known or future active semiconductor structures 22.

A front electrical contact 34 overlies and contacts the active semiconductor structure front side 24. A portion of the front electrical contact 34 is a current collector 36, illustrated in the form of metallic strips 38, that contact the active semiconductor structure front side 24 and, in cooperation with the back electrical contact 28, collect the current produced by the active semiconductor structure 22. These strips 38 do not cover the entire active semiconductor structure front side 24, because the illumination must reach at least a portion of the active semiconductor structure front side 24. Another portion of the front electrical contact 34 is a busbar 39 to which the current collected in the current collector 36 is conducted. The front electrical contact 34 also includes an attachment pad region 40 to which a front electrical lead 52 is attached.

As shown in greater detail in FIG. 3, the front electrical contact 34 includes a titanium layer 42 overlying and contacting the active semiconductor structure front side 24, a diffusion layer 44 overlying and contacting the titanium layer 42, a barrier layer 46 overlying and contacting the diffusion layer 44, and a joining layer 48 overlying and contacting the barrier layer 46. The titanium layer 42 is preferably pure titanium, but titanium alloys may be used. The diffusion layer 44 is preferably gold, but other metals such as palladium may be used in some cases. The barrier layer 46 is preferably platinum, but nickel, palladium, rhodium, or other noble metals may be used. The joining layer 48 is preferably silver, but other metals such as gold, aluminum, or copper may be used. As used here unless otherwise stated, the specification of a metal can include the unalloyed metal or alloys of the metal. In most cases, the pure metals are used to maximize electrical conductivity, but in some cases alloys of the specified metal with other elements may be used for improved strength or other properties.

The selection of the composition and ordering of the layers of the front electrical contact 34 is critical. Titanium adheres well to semiconductor materials, particularly when gold is diffused into and through the titanium layer 42 to the bondline region 50 between the front electrical contact 34 and the active semiconductor structure 22. The titanium layer 42 must therefore contact the active semiconductor structure 22, and the diffusion layer 44 must therefore overlie and contact the titanium layer 42 so that atoms from the diffusion layer may diffuse into the titanium layer 44 and to the bondline 50 during fabrication and service. The joining layer 48 must be the topmost layer of the front electrical contact 34, because it provides a good material for the affixing of a front electrical lead 52 to the front electrical contact. The silver or other metal from the joining layer 48 and the material of construction of the front electrical lead 52 are potentially deleterious to the adhesion of the front electrical contact 34 to the active semiconductor structure 22 and are also deleterious to the performance of the active semiconductor structure 22. The barrier layer 46 must therefore be placed between the joining layer 48 and the diffusion layer 44 to inhibit mass diffusion from the joining layer 48 and the front electrical lead 52 to the bondline region 50 and into the active semiconductor structure 22, but not inhibit diffusion of atoms from the diffusion layer 44 into the titanium layer 42.

The front electrical lead 52 may be a discrete wire, as illustrated, bonded, soldered, or welded to the attachment pad region 40 of the front electrical contact 34. It may instead be a layer deposited upon the active semiconductor structure, or any other operable structure.

Preferably, the titanium layer 42 has a thickness of from about 50 Angstroms to about 250 Angstroms, the diffusion layer 44 has a thickness of from about 100 Angstroms to about 600 Angstroms, the barrier layer 46 has a thickness of from about 100 Angstroms to about 1000 Angstroms, and the joining layer 48 has a thickness of from about 20,000 Angstroms to about 70,000 Angstroms. The titanium layer 42 must be sufficiently thick to achieve full coverage over the active semiconductor structure front side 24, but not so thick that it prevents diffusion of the metal from the diffusion layer 44 to the active semiconductor structure front side 24. The diffusion layer 44 must be sufficiently thick to ensure adhesion to the front electrical contact 34 to the active semiconductor structure front side 24, but not so thick that it degrades the adhesion by other mechanisms such as thermal fatigue due to differences in thermal expansion coefficients. The barrier layer 46 must have a sufficiently great thickness to achieve the required diffusion barrier, but not so thick that it degrades the adhesion by other mechanisms such as thermal fatigue due to differences in thermal expansion coefficients. The thickness of the joining layer 48 is selected for convenience.

Figure 4:
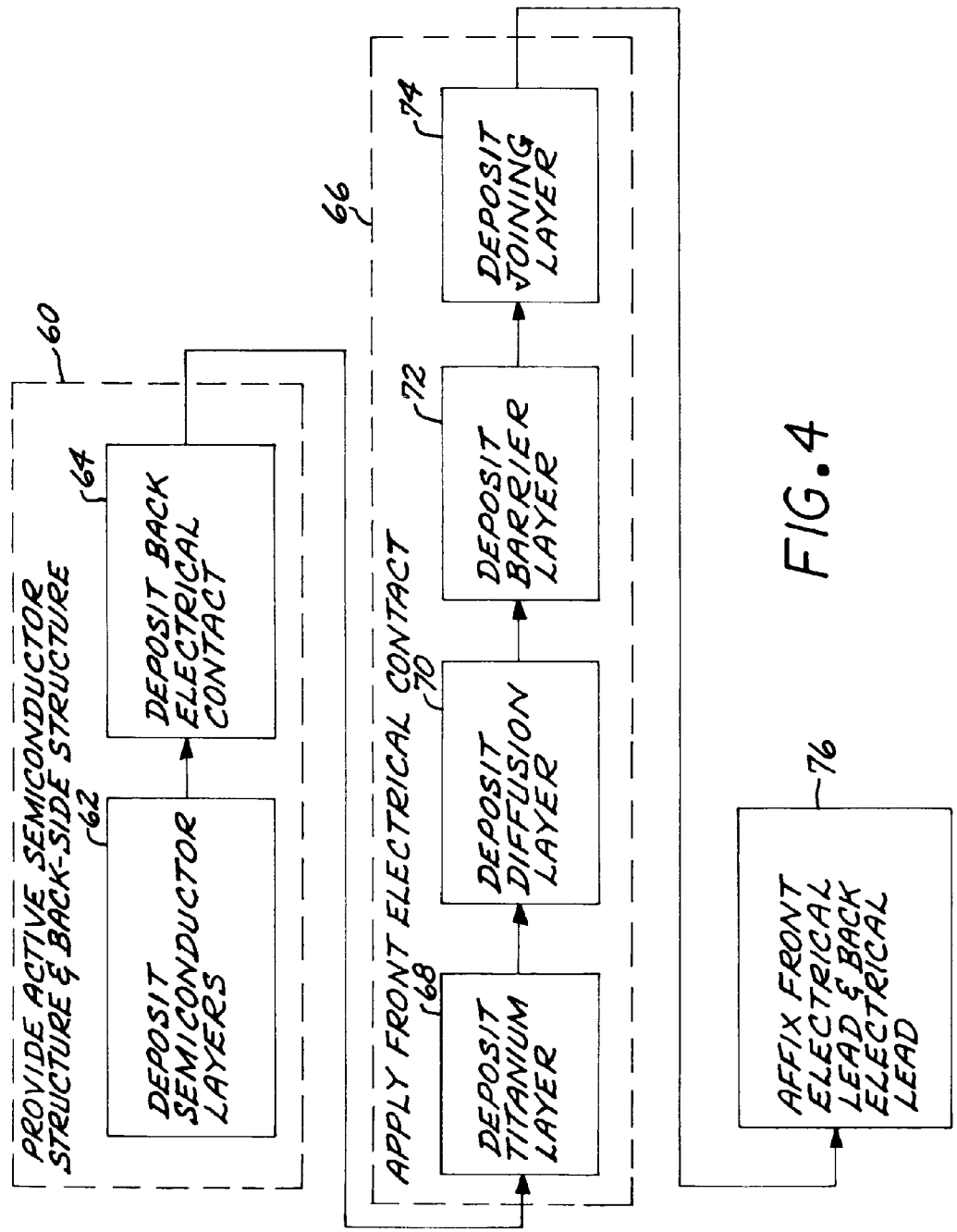
FIG. 4 is a block flow diagram of a preferred approach for fabricating an embodiment of the present solar cell.

FIG. 4 depicts a preferred approach for fabricating a preferred solar cell by the present approach. The active semiconductor structure 22 and the back-side structure, including the back electrical contact 28, are provided, numeral 60. Typically, the semiconductor layers 30 of the active semiconductor structure 22 are deposited upon a substrate, numeral 62, and the back electrical contact 28 is deposited overlying and contacting the active semiconductor structure 22, numeral 64. Techniques and processes for performing the step 60 and its substeps are known in the art, see for example U.S. Pat. No. 5,330,585, whose disclosure is incorporated by reference.

The front electrical contact 34 is applied, numeral 66, overlying and contacting the active semiconductor structure front side 24, by sequentially depositing the layers that form the front electrical contact 34. The titanium layer 42 is first deposited overlying and contacting the active semiconductor structure front side 24, numeral 68. The lateral extent of the titanium layer 42 defines the front electrical contact 34. The titanium layer 42 may be deposited using a stand-off mask or a photolithographic mask. The diffusion layer 44 is thereafter deposited overlying and contacting the titanium layer 42, numeral 70. The barrier layer 46 is thereafter deposited overlying and contacting the diffusion layer 44, numeral 72. The joining layer 48 is thereafter deposited overlying and contacting the barrier layer 46, numeral 74.

The sequential application of the various layers 42, 44, 46, and 48 of the front electrical contact 34, numeral 66, may be performed by any operable approach, but is preferably performed by vacuum vapor deposition, a known technique for other applications. In vacuum vapor deposition, the structure that is to be deposited upon (here the already-fabricated active semiconductor structure 22) is loaded into a vacuum chamber. The vacuum chamber is pumped down to a low deposition pressure, and the deposition is performed. Each pumpdown of the vacuum chamber from ambient pressure to the deposition pressure is time consuming and therefore an expensive step in the fabrication of the solar cells. One of the desirable features of the preferred approach is that the entire front electrical contact 34 may be deposited by vacuum deposition in a single pumpdown or evacuation of the vacuum chamber from ambient pressure. The layers 42, 44, 46, and 48 are sequentially deposited from different deposition sources within the same vacuum chamber during the single pumpdown cycle. Steps 64 and 66 may be reversed in order, with the front electrical contact 34 deposited before the back electrical contact 28 is deposited.

During fabrication and service, atoms of the diffusion layer 44 may diffuse into the titanium layer 42 so as to form a first region having a composition formed from the diffusion layer composition and the titanium layer composition. The remaining atoms of the diffusion layer 44 that do not diffuse form a second region having a composition of the diffusion layer 44.

Lastly, the front electrical lead 52 and the back electrical lead 29 are affixed to their respective locations, numeral 76. The affixing may be accomplished by any operable technique, such as wire bonding, soldering, or welding. If one or both of the electrical leads 52, 29 are deposited layers, they are deposited by any operable approach, such as vacuum vapor deposition.

Other features of the present approach, as discussed elsewhere herein, may be used in conjunction with this processing approach.

The preferred structure as depicted in FIGS. 1-3 has been practiced on a laboratory scale using the fabrication approach of FIG. 4. Solar cells have been successfully fabricated. For comparative testing, the diffusion layer 44 was gold, the barrier layer 46 was platinum, and the joining layer 48 was silver. Comparative accelerated life testing was performed against a prior art solar cell in which the front electrical contact 34 was formed of a layer of titanium overlying the front side of the active semiconductor structure, a layer of gold overlying the titanium layer, and a layer of silver overlying the diffusion layer. There was no barrier layer present in the comparison structure. The accelerated life testing was performed by holding the test solar cells at a temperature of 270° C. in a nitrogen environment.

Degradation of the electrical performance of the solar cells made without the barrier layer was 3-4 times as fast as the degradation measured for the solar cells made by the present approach, with the barrier layer 46 present.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A structure, comprising:
   an active semiconductor structure having an active semiconductor front side and an active semiconductor structure back side, wherein the active semiconductor structure produces a voltage between the active semiconductor structure front side and the active semiconductor structure back side when illuminated from the active semiconductor structure front side;
   a back electrical contact overlying and contacting the active semiconductor structure back side;
   a front electrical contact overlying and contacting the active semiconductor structure front side, wherein the front electrical contact has multiple layers comprising:
      a first region overlying and contacting the active semiconductor structure front side, the first region consisting essentially of titanium and gold or palladium;
      a second region consisting essentially of gold or palladium and overlying and contacting the first region,
      a barrier layer overlying and contacting the gold or palladium diffusion layer, and
      a joining layer overlying and contacting the barrier layer; and
   a front electrical lead overlying and affixed to an attachment pad region of the joining layer of the front electrical contact;
   wherein the first region is formed by diffusing gold or palladium into a deposited titanium layer.

2. The structure of claim 1, wherein
   The first region has a thickness of from about 50 Angstroms to about 250 Angstroms,
   the second region has a thickness of from about 100 Angstroms to about 600 Angstroms,
   the barrier layer has a thickness of from about 100 Angstroms to about 1000 Angstroms, and
   the joining layer has a thickness of from about 20,000 Angstroms to about 70,000 Angstroms.

3. The structure of claim 1, wherein the front electrical contact comprises a current collector.

4. The structure of claim 1, wherein the front electrical contact comprises a busbar.

5. The structure of claim 1, wherein the barrier layer is made of a barrier-layer metal selected from the group consisting of noble metals and nickel.

6. The structure of claim 1, wherein the joining layer is made of a joining-layer metal selected from the group consisting of silver, gold, aluminum, and copper.

7. The structure of claim 1, wherein the active semiconductor structure comprises a doped silicon layer or a doped gallium arsenide layer.

* * * * *